United States Patent

Glovatsky et al.

Patent Number: 5,964,395
Date of Patent: Oct. 12, 1999

[54] PREDEPOSITED TRANSIENT PHASE ELECTRONIC INTERCONNECT MEDIA

[75] Inventors: Andrew Z. Glovatsky, Livonia; Mohan R. Paruchuri, Canton, both of Mich.

[73] Assignee: Ford Motor Company, Dearborn, Mich.

[21] Appl. No.: 08/868,846

[22] Filed: Jun. 9, 1997

[51] Int. Cl.⁶ .......................... B23K 31/02; B23K 35/12
[52] U.S. Cl. ........................ 228/123.1; 228/180.21; 228/254; 228/261
[58] Field of Search ........................ 228/254, 258, 228/262, 180.21, 261, 123.1; 427/96

[56] References Cited

U.S. PATENT DOCUMENTS

| | | | |
|---|---|---|---|
| 3,248,476 | 4/1966 | Cilino . | |
| 3,825,164 | 7/1974 | Sarnacki et al. | 228/37 |
| 3,928,907 | 12/1975 | Chisholm | 29/527.4 |
| 4,816,219 | 3/1989 | Nishimura | 420/589 |
| 5,170,930 | 12/1992 | Dolbear et al. | 228/123 |
| 5,320,272 | 6/1994 | Melton et al. | 228/180.21 |
| 5,340,015 | 8/1994 | Hira et al. | 228/254 |
| 5,381,945 | 1/1995 | Leicht | 228/180.21 |
| 5,597,110 | 1/1997 | Melton et al. | 228/254 |

*Primary Examiner*—Patrick Ryan
*Assistant Examiner*—Kiley Stoner
*Attorney, Agent, or Firm*—Damian Porcari

[57] ABSTRACT

A method of attaching an electronic component to a substrate comprising the steps of depositing a spray metal coating atop a substrate. An electronic component is placed atop a coating. A liquid metal is dispensed on or near the component. The liquid metal wets the component and the coating. The metal is reacted with the coating to form an electrically conductive bond with the substrate and adheres the component to the substrate. The reactive metal may be heated to a temperature which makes it liquid and facilitates wetting the coating and component. Suitable materials for the spray metal coating include copper, nickel, tin, bismuth, lead and silver and mixtures thereof. Suitable liquid metals generally include low melting temperature metals such as gallium and indium and mixtures thereof.

4 Claims, 3 Drawing Sheets

PREDEPOSITED TRANSIENT PHASE ELECTRONIC INTERCONNECT MEDIA

FIELD OF THE INVENTION

The present invention relates to a method and composition for attaching an electronic component to a wiring circuit substrate. More specifically, the invention relates to a method and composition for depositing a spray metal or alloy coating atop an electronic circuit and forming an electronically conductive interconnect that secures the component to the circuit.

BACKGROUND OF THE INVENTION

Description of the Related Art

It is known to manufacture electrical solders for connecting an electronic component to a wiring circuit. Generally, solders are alloys of elemental metals that are formed into a paste or wire. The solder paste or wire is heated to melt to form a solder joint between the electronic components and circuits.

High speed electronic manufacturing generally utilizes printed solder pastes. The solders are placed atop strategic areas of an electronic circuit. Electronic components are placed atop the solder paste and the assembly is heated in an oven until the solder paste melts and bonds the electronic component to the circuit. A wide variety of solder compositions exist to secure electronic components to the circuits. Recently, environmental regulations have spurred the development of lead free-solder alloys which are preferred over solders that contain lead. Additionally, the develpoment of low temperature substrates is driving the use of lower temperature soldering processes.

The disadvantage of using solder paste or solder wire is that the temperature required to melt the solder and cause it to flow damages fragile electronic components or delicate substrates used for wiring circuit substrates. Generally, even low temperature solders melt between 110 to 165° C. This requires that substrate material and electronic components be made from material that can withstand a prolonged exposure to these temperatures. It is desirable to manufacture substrates and components from materials that are generally damaged by temperature in excess of 100–150° C. While the compositions and methods of the present invention are suitable for all types of substrates and higher temperature soldering, they are especially useful for lower temperature applications. It is desirable to use polymeric substrates of low cost and light weight materials such as Acrylonitrira Butadiene Styrene (ABS), Polyethylene Terephthalate (PET) and Potyamide (nylon—PA). These low cost, light weight substrates may become damaged when heated above 105° C. A composition that may be soldered at lower temperatures allows these materials to be used as substrates.

It is also desirable to manufacture substrates having a three dimensional contour. Circuits made with a three dimensional contour allow for greater flexibility when manufacturing and designing electronic components. Components may be attached on horizontal, semi-horizontal; curved or vertical surfaces of the circuit. The housing of the electronic device may serve a dual function and act as both a substrate for an electronic circuit as well as the housing for the electronic device. One automotive application that uses this technique is surface mounting electronic components directly atop automotive components. It is desirable to use three dimensional surfaces, such as ventilating ducts, as the substrate for electronic circuits as illustrated in commonly assigned U.S. patent application 08/642,287.

Heretofore, it has been difficult to manufacture electronic components and modules that have a highly contoured three dimensional surface because conventional high speed solder paste equipment relies on transfer platens or stencils to transfer the solder paste to the substrate. These stencils or platens work best with flat, two dimensional surfaces. Neither the stencils nor the platens work on the three dimensional surfaces.

In another aspect of the present invention, it is generally known that the surface properties of a material may be enhanced or modified with the application of a thermal spray. Thermal spray coatings include carbides, ceramics, metallics, cermets and plastics. Thermal spray coatings are commonly used to resist erosion, abrasion or to protect the underlying components from excessive temperature, oxidation or wear. Heretofore, thermal sprays have not been used to provide the basis for an electronic interconnect between an electronic component and a circuit.

SUMMARY OF THE INVENTION

The present invention relates to a method of attaching an electronic component to a substrate comprising the steps of depositing a spray metal coating atop a substrate. An electronic component with compatible surface finish metallurgy which can be applied via thermal spray or plating is placed atop a coating. A liquid metal is dispensed on or near the component. The liquid metal wets the component and the coating. The metal is reacted with the coating to form an electrically conductive bond with the substrate and adheres the component to the substrate.

The reactive metal may be heated to a temperature which makes it liquid and facilitates wetting the coating and component. The heating step may be a conventional heater or may be an exothermic reaction between the metal and the coating.

Suitable materials for the spray metal coating include copper, nickel, tin, indium, bismuth, lead and silver and mixtures thereof and solder alloys of tin-lead and tin-silver eutectics. Suitable liquid metals generally include low melting temperature metals such as gallium and indium and mixtures thereof.

Gallium and indium and mixtures thereof have very low melting points and may be applied in liquid form without damaging sensitive substrates or electronic components. The liquid metal wets the electronic component and the porous spray metal coating. The assembly is then heated so that the liquid metal and coating intermix and interdiffuse. After the reaction has completed, the resulting alloy has a higher melting temperature than the liquid metal.

This invention is especially useful when applying a spray metal coating atop a three dimensional substrate. The spray coating may be evenly deposited atop a three dimensional surface using conventional spray equipment. The equipment may be placed a fixed distance from the substrate or for more even coatings, the equipment or substrate may be positioned to remain a constant distance apart during the thermal spray application. A removable mask be used to protect areas of the substrate that should not receive the spray coating. The invention provides for a high speed, low cost method of applying an interconnect material to a three dimensional surface. Additionally, the invention provides for a lead free, low temperature interconnect material that is suitable for use with low melting temperature substrates and fragile electronic components.

Another use of spray metal interconnection media is the use of pre-alloyed solder spray powders. These solder powders are comprised of typical solder alloy elemental constituents such as Sn (tin), Pb (lead), Bi (Bismuth), and In (Indium) and can be formulated to create a low temperature solder alloy compatible to thermally sensitive substrates. For example, utectic alloys of Sn48/In52 (melt point 118° C.)

and Sn42/Bi52 (melt point 138° C.) can be used for low temperature substrate applications. Also higher temperature solder alloys of Sn63Pb73 (melt point 183° C.) and Sn96.5Ag3.5 (melt point 221° C.) can be used depending upon the substrate and solder process. These alloys can be sprayed as described earlier onto the circuitry of a substrate that is either planar or three-dimensional. A mask would be used to prevent the spray from adhering to areas of the substrate where the coating is desired. The deposit can be either solid or porous and the deposit is pre-alloyed so it does not require any further metallurgical reaction. Upon removal of the mask, a solder deposit remains on component mounting sites. The mask, in conjunction with the spray process, results in the formation of a planar deposit of a given thickness. This planar deposit aids in the placement of components and the thickness provides the desired volume of solder to form the solder joint. Flux is applied to the site and a component is placed on the site. The assembly is then heated through a reflow oven or by any other heating method where the solder melts and wets to the component leads creating a solder joint. The solder joint forms an electrical and mechanical interconnection between the substrate and component lead.

These and other advantages, features and objects of the present invention will become more apparent to those of ordinary skill in the art upon reference of the following description and the accompanying drawings.

DETAILED DESCRIPTION OF THE PREFERRED EMBODIMENTS

Figure 1:
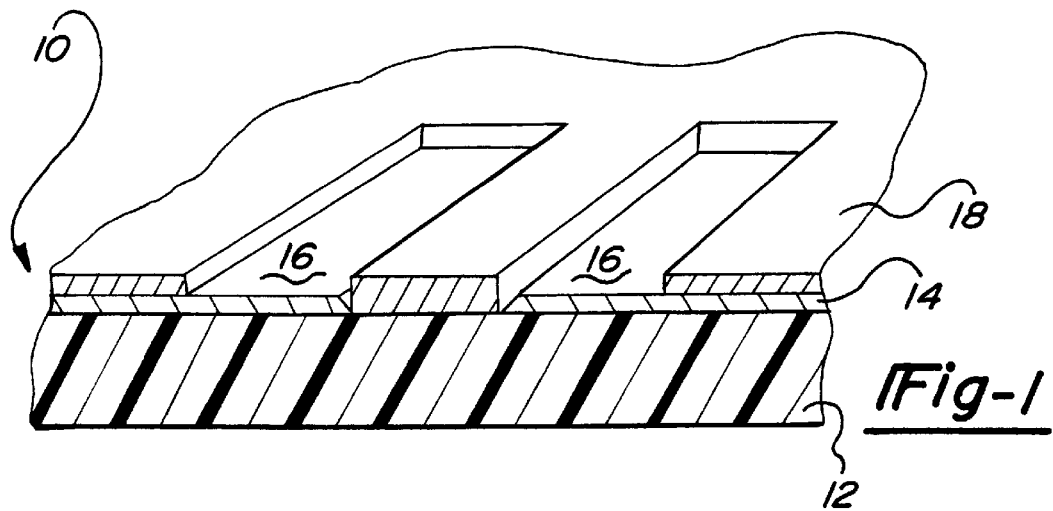
FIG. 1 is a perspective view, partially broken away, of a substrate and an electronic circuit.

The present invention is illustrated in FIGS. 1–7. FIG. 1 is a detailed perspective view, partially broken away of a circuit assembly 10. The circuit assembly 10 comprises a substrate 12 carrying an electronic circuit 14. The substrate 12 is formed in a highly, contoured three dimensional shape as will be shown in FIG. 7. While the invention has been illustrated using a contoured substrate, flat two-dimensional substrates may also be used in the present invention using the methods and compositions described herein. The substrate 12 is made from a polymeric material such as ABS, PET or nylon and is formed into a three dimensional shape by means of injection molding, compression molding, blow molding or the like. Atop the substrate 12, is a printed electronic circuit 14. The circuit 14 is applied to the substrate 12 through known methods such as embossing, in-molding flex circuits, lamination and plating and etching methods. The circuit 14 is generally made from a conductive metal such as copper. Other suitable materials include aluminum, silver, gold, nickel, palladium or conductive inks such as silver.

Enlarged areas on the circuit 14 receive electronic components. The enlarged areas, identified as pads 16, receive a spray metal coating. Areas of the substrate 12 and the circuit 14 that are not in contact with the electronic component are masked with a resist coating 18. The resist coating 18 is made from a photoimagable polymeric resist. It is applied through dip coating, spraying to the part or electrodeposited. The coating is imaged to define openings. Other types of resist coating are known in the art of electronic manufacturing and are suitable for use with the present invention. Alternatively, a metal mask made from a non-wettable material such as stainless steel or titanium may be used in place of the resist coating to protect the substrate 12 and circuit 14 from overspray. Also, non-metallic masks such as polymer based masks can be used such as a polyimide film mask.

Figure 2:
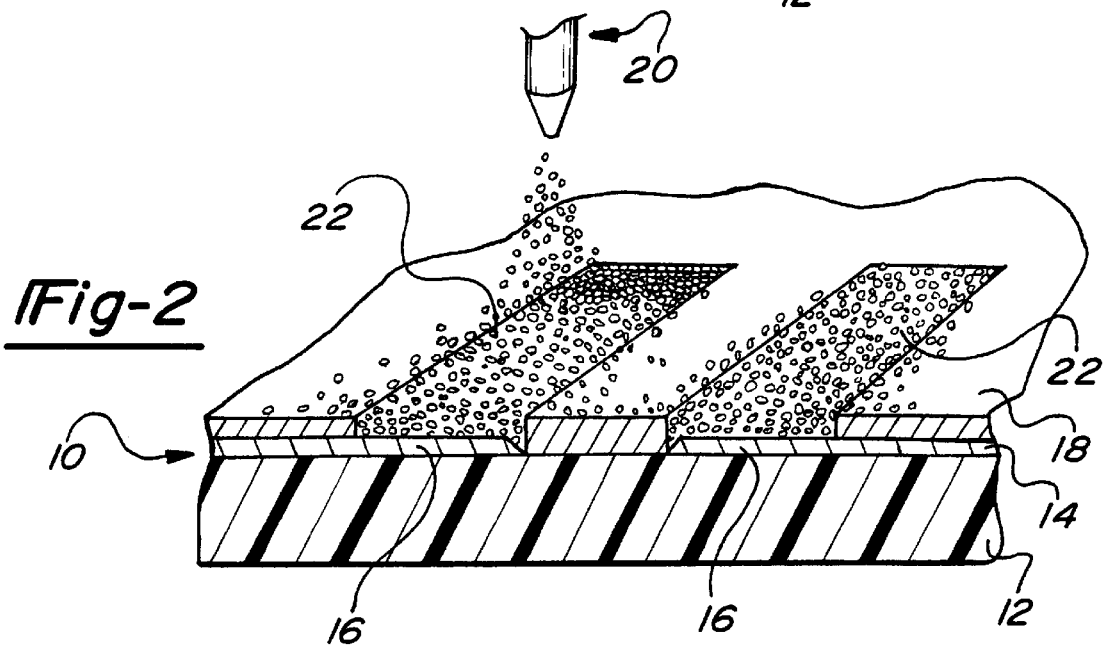
FIG. 2 illustrates a spray coating being deposited atop the circuit illustrated in FIG. 1.

After the substrate 12 and the circuit 14 are masked with the resist coating 18, the exposed areas of the pad 16 are brought into contact with a metal spray coating as illustrated in FIG. 2. A nozzle 20 dispenses a high speed spray of metal alloy powder atop the pad 16. A layered built-up of the spray metal forms the coating 22. The coating 22 is deposited to a thickness between 0.001 to 0.025 inches. The coating 22 that is deposited atop the pad 16 is generally porous. The porosity of the coating 22 is preferably between 10 and 75% void and more preferably between 30 and 50% void. The voids allow a liquid metal to penetrate the coating 22 and to readily react with the large surface area of the deposited metals.

A wide variety of suitable sprayed metals exist and are generally selected from metals capable of reacting to form a higher melting alloy and having good electrical properties and good adhesion to the copper pad 16. Both metals evaluated, tin and copper, provide a suitable electrical interconnect. Other metals such as lead, nickel, bismuth, gold, silver and indium or solder alloys may also be deposited using the methods described. The coatings are deposited in ratios required for the formation of the final desired alloy. The alloy may be deposited in one or more layers to form the coating 22.

A variety of methods may be used to form the metal coating including plasma spraying, thermal spraying, sonic spraying (a high speed physical spray) or electroplating. A plasma spray was used to deposit a coating by mixing powdered copper in a carrier gas and injecting the copper/carrier gas into a plasma where the copper is melted or softened and propelled at high speed onto the pad 16. Optionally, particles of filler material may be co-deposited with the metal spray. The filler particles are later removed with the resist coating 18 to form voids or cavities in the coating 22. Even though the metal is exposed to very high temperatures, the pad 16 and the underlying substrate 12, remain relatively cool. Due to the size of the particles, little thermal energy is imparted to the substrate thus keeping it relatively cool as compared to the spray nozzle. The plasma spray does not damage or distort the lower melting temperature substrate 12. The process variables, including the carrier gas flow, arc gas flow, particle size, filler particles type, gun, nozzle design, amperage and voltage are all selected so as to cause the coating 22 to contain a preferred void percentage.

The examples identified below were used to deposit a coating atop a copper pad for use as an electrical circuit interconnection metallurgy.

EXAMPLE 1

A thermal spray of 20% Cu, 72% Ni and 8% Ag is sprayed onto a substrate using a thermal spray apparatus. The coating was reacted with liquid Ga to form an interconnect.

Thermal spray parameters
  Voltage: 20–100 kw
  Gas: $N_2$
  Gas Pressure: >8 psi
  Particle size~5.5 µm
Resulting Coating
  Thickness: 0.005–0.025 in
  Void: 20–50%
  Adhesion >5 lbs/in

| | (100–150 C.°) |
|---|---|
| Cu/Ni/Ag (solid) + Ga (liquid) | → Cu/Ni/Ag/Ga (intermetallic) |
| (10–40% porous) (32° C.) | (1–6 hrs) |

EXAMPLE 2

A thermal spray of 33% Cu/67% Ni is sprayed onto a substrate using the thermal spray equipment and perimeters described in Example 1.

| | (100–150 C.°) |
|---|---|
| Cu/Ni (solid) + Ga (liquid) | → Cu/Ni/Ga (intermetallic) |
| (10–50% porous) (32° C.) | (1–6 hrs) |

EXAMPLE 3

A thermal spray of Sn is sprayed onto a substrate using the thermal spray equipment and parameters described in Example 1. The liquid metal is an alloy of 57% Bi/25% In/18% Sn (weight percent).

| | (100–150 C.°) |
|---|---|
| Sn (solid) + Bi/In/Sn (liquid) | → Bi/In/Sn (intermetallic) |
| (20–50% porous) (80° C.) | (1–6 hrs) |

Figure 3:
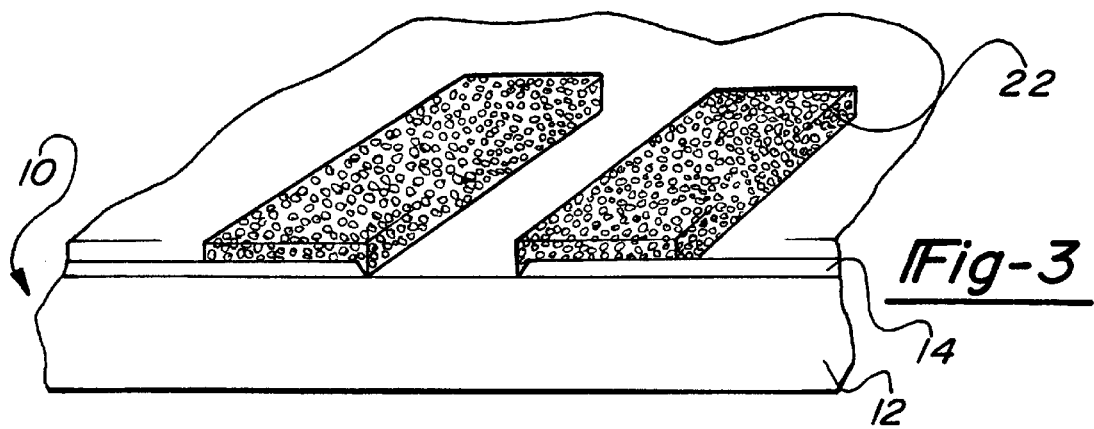
FIG. 3 illustrates the circuit in FIG. 2, with the resist coating and excess spray coating removed.
Figure 4:
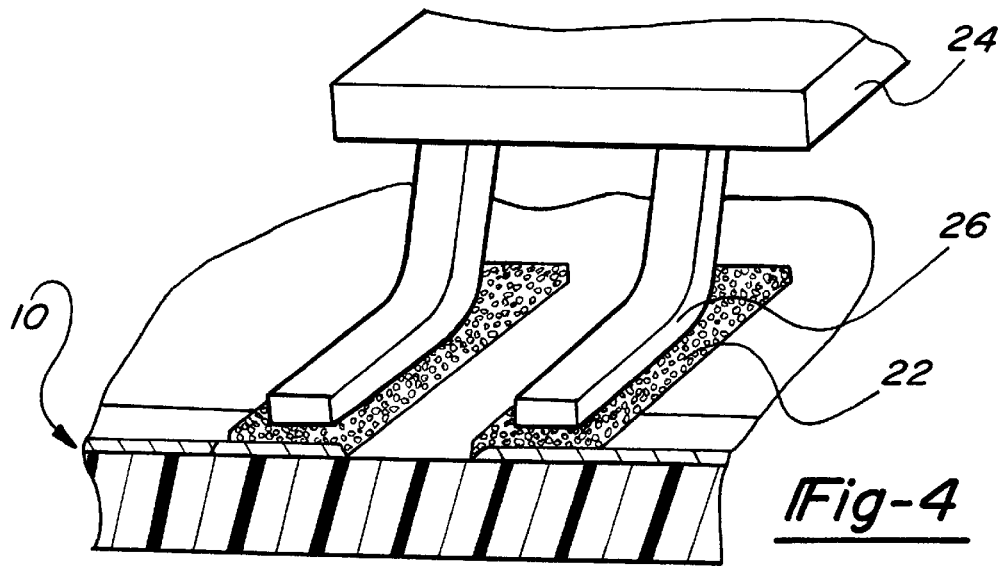
FIG. 4 illustrates an electronic component placed atop the coating illustrated in FIG. 3.
Figure 5:
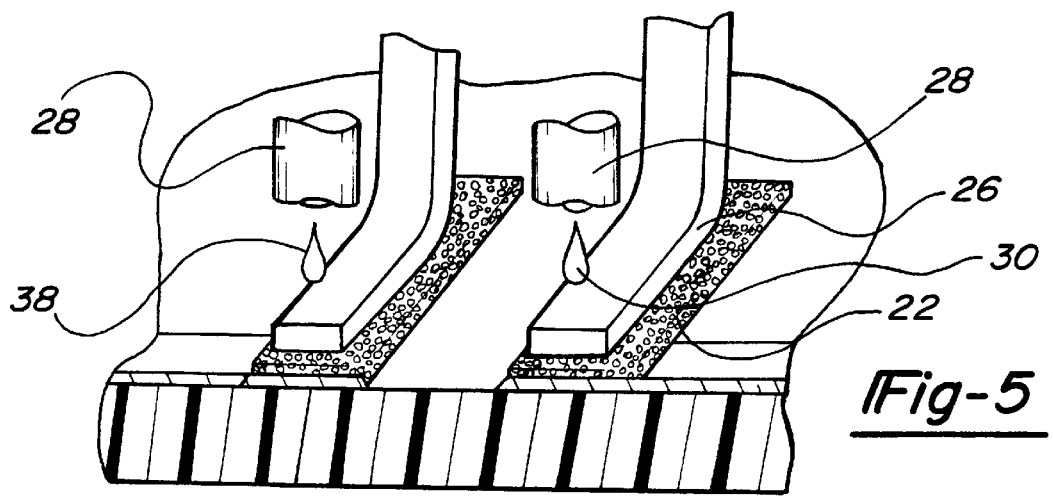
FIG. 5 illustrates dispensing a liquid metal adjacent the electronic component in FIG. 4.
Figure 6:
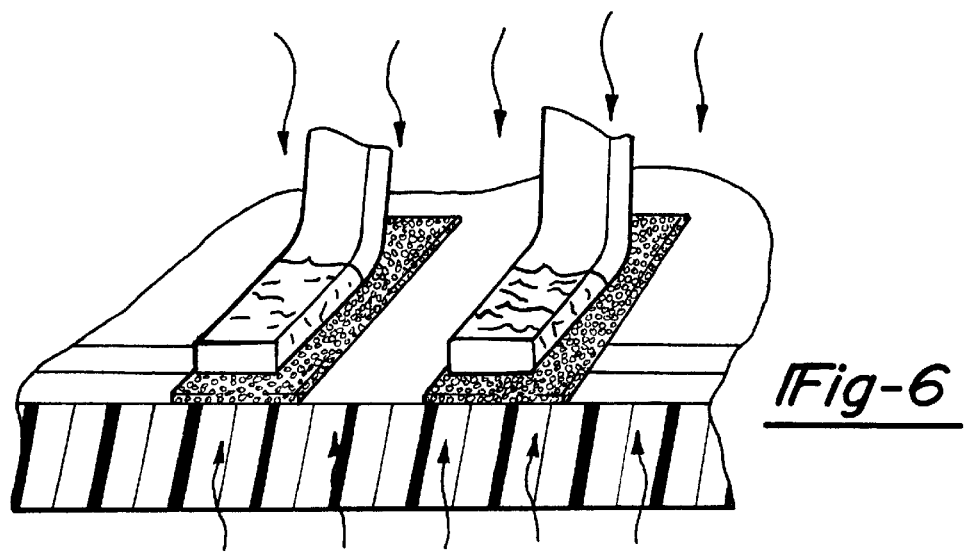
FIG. 6 illustrates the reaction between the liquid metal and the spray coating.

Once the thermal spray coating is applied to the pad 16, the resist coating 18 is removed by a chemical stripping agent. The circuit assembly 10 contains areas atop the pad 16 that include the coating 22. Over-spray areas which were previously coated by the resist coating 18 are cleaned as illustrated in FIG. 3 with the removal of the resist. The resist is removed via etching or chemical dissolution.

The coated circuit assembly 10 may remain in this state for an extended period of time. The coating 22 is not easily damaged by abrasion or scuffing and does not dry or degrade over a period of time. It does not need special handling, packaging or environmental controls pending final assembly of the electronic circuits. The coated circuit assembly 10 may be immediately assembled with an electronic circuit or may be stored pending assembly at a later time. Long term storage of the coating only requires an anti-oxidant coating such as a gold tin or an organic surface coating such as benzotriazole.

The assembly process is illustrated in FIGS. 4–7. An electronic component 24 having leads 26 is placed atop the circuit assembly 10. The leads 26 overlie and are juxtaposed the coating 22. The coating 22 is normally not tacky. The component 24 may be held by a tool (not shown) or alternatively a small amount of fixturing material such as glue dots (not shown) on the component may be applied to the electronic component 24 or soldering flux applied to the leads 26 to retain the electronic component 24 in position atop the circuit assembly 10. The liquifier 28 heats a metal to a temperature in excess of its melting point and then dispenses controlled quantities of the then liquid metal directly atop the leads 26. The liquid metal 30 completely wets all surfaces of the leads 26 and fills the voids within the coating 22.

Suitable materials for the liquid metal 30 include gallium and alloy blends of bismuth, indium, tin, copper and nickel. The liquid metal is selected from a material that will react when heated with the coating 22 form a solid metal interconnection with the lead 26.

Depending on the coating 22 and the liquid metal material 30, the circuit assembly may be optionally heated to initiate or continue the reaction between the liquid metal and the coating 22. Alternatively, the reaction may proceed unaided.

Figure 7:
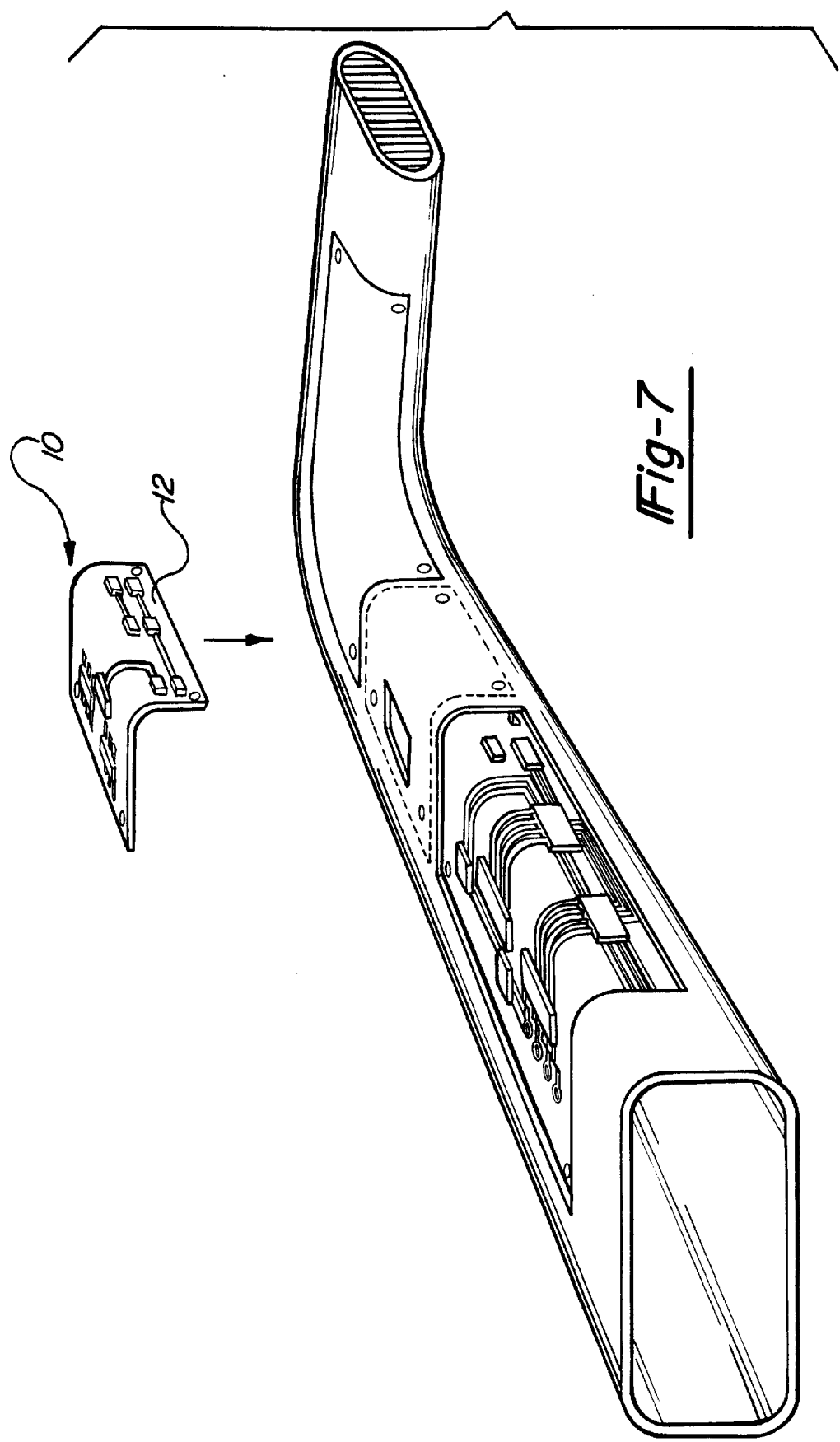
FIG. 7 is a perspective view of a finished electronic component secured to a substrate.

The coating 22 and liquid metal 30 react to form an intermetallic interconnect. The circuit assembly 10 is allowed to cool and the electronic components 24 become securely affixed to the substrate 12. Using the methods described, electronic components may be adhered to a three-dimensional contoured surface as shown in FIG. 7.

The present invention, therefore, is well adapted to fulfill the objects, features and advantages outlined above as well as others that are inherent therein. While the present invention has been described by the preferred embodiments illustrated above, the invention includes numerous changes in the detail of construction, arrangement of the components, steps in the process, and alternative compositions of the coating and liquid metal, all of which are encompasses within the spirit of the invention and the scope of the appended claims.

We claim:

1. A method of attaching an electronic component to a substrate comprising the steps of:

depositing a metal coating atop a substrate;

adding a filler to said deposited metal coating and then removing said filler from said metal coating, whereby said metal coating is between 10 and 75% void after said filler is removed;

placing an electronic component atop said coating;

dispensing a liquid metal near said component, said liquid metal wetting said component and said coating;

reacting said metal with said coating to form an electrically conductive bond between said substrate and said component.

2. A method of attaching an electronic component to a metal electrical circuit comprising the steps of:

depositing a coating of a thermal spray metal and a filler atop selected areas of said circuit, said filler comprising between 10–70% of said coating;

removing said filler from said coating whereby said coating is between 10–70% void;

placing an electronic component atop said coating;

heating a reactive metal to a liquid state;

dispensing said liquid metal near said component, said liquid metal wetting said component and penetrating said coating;

reacting said liquid metal with said coating to form an electrically conductive bond between said circuit and said component.

3. The method of claim 2, wherein said spray metal is selected from the group comprising Cu, Ni, Sn, Pb and Ag and combinations thereof.

4. The method of claim 2, wherein said liquid metal is selected from Ga and alloys of Bi, In and Sn.

* * * * *